US011817305B2

(12) United States Patent
Kirby et al.

(10) Patent No.: US 11,817,305 B2
(45) Date of Patent: Nov. 14, 2023

(54) FRONT END OF LINE INTERCONNECT STRUCTURES AND ASSOCIATED SYSTEMS AND METHODS

(71) Applicant: Micron Technology, Inc., Boise, ID (US)

(72) Inventors: Kyle K. Kirby, Eagle, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 17/325,122

(22) Filed: May 19, 2021

(65) Prior Publication Data

US 2022/0068765 A1 Mar. 3, 2022

Related U.S. Application Data

(60) Provisional application No. 63/175,443, filed on Apr. 15, 2021, provisional application No. 63/071,983,
(Continued)

(51) Int. Cl.
*H01L 23/48* (2006.01)
*H01L 23/00* (2006.01)
(Continued)

(52) U.S. Cl.
CPC ...... *H01L 23/481* (2013.01); *H01L 21/76877* (2013.01); *H01L 24/08* (2013.01);
(Continued)

(58) Field of Classification Search
CPC ............. H01L 45/1233; H01L 45/146; H01L 27/2481; H01L 45/08; H01L 45/147;
(Continued)

(56) References Cited

U.S. PATENT DOCUMENTS 10,199,326 B1 2/2019 Ohsaki
10,354,980 B1 7/2019 Mushiga et al.
(Continued)

OTHER PUBLICATIONS

International Application No. PCT/US2021/046461—International Search Report and Written Opinion, dated Dec. 10, 2021, 13 pages.
(Continued)

*Primary Examiner* — Niki H Nguyen
(74) *Attorney, Agent, or Firm* — Perkins Coie LLP

(57) ABSTRACT

Systems and methods for a semiconductor device having a front-end-of-line structure are provided. The semiconductor device may include a dielectric material having a backside formed on a front side of a semiconductor substrate material and a front side, and an interconnect structure extending through the dielectric material. The interconnect structure may be electrically connected to a semiconductor memory array proximate the front side of the dielectric material. The semiconductor device may further have an insulating material encasing at least a portion of the semiconductor memory array and an opening created during back-end-of-line processing through which the active contact surface at the backside of the interconnect structure is exposed for electrical connection.

19 Claims, 12 Drawing Sheets

Related U.S. Application Data filed on Aug. 28, 2020, provisional application No. 63/071,969, filed on Aug. 28, 2020.

(51) Int. Cl.
  *H01L 29/40* (2006.01)
  *H01L 21/768* (2006.01)

(52) U.S. Cl.
  CPC .... *H01L 24/80* (2013.01); *H01L 2224/08146* (2013.01); *H01L 2224/80895* (2013.01); *H01L 2224/80896* (2013.01)

(58) Field of Classification Search
  CPC ............... H01L 27/2463; H01L 45/085; H01L 27/2418; H01L 45/12; H01L 27/0688; H01L 45/1253; H01L 45/16; H01L 23/528; H01L 27/2409; H01L 25/0657; H01L 45/1226; H01L 45/145; H01L 2924/00014; H01L 25/18; H01L 27/2436; H01L 27/249; H01L 43/12; H01L 45/1616; H01L 27/10873; H01L 27/24; H01L 23/5226; H01L 25/50; H01L 2225/06541; H01L 27/10897; H01L 27/228; H01L 23/53238; H01L 23/5223; H01L 21/76883; H01L 24/06; H01L 27/0629; H01L 2924/01014; H01L 29/78609; H01L 45/122; H01L 2924/37001; H01L 2924/3025; H01L 2924/14511; H01L 2924/1421; H01L 29/792; H01L 2924/01047; H01L 29/66545; H01L 29/66628; H01L 28/20; H01L 28/65; H01L 23/58; H01L 23/573; H01L 27/111565; H01L 27/11565; H01L 23/481; H01L 21/76877; H01L 24/08; H01L 24/80; H01L 2224/08146; H01L 2224/80895; H01L 2224/80896

See application file for complete search history.

(56) References Cited

U.S. PATENT DOCUMENTS

| | | | |
|---|---|---|---|
| 10,629,616 | B1 | 4/2020 | Kai et al. |
| 10,903,164 | B2 | 1/2021 | Nishida |
| 11,171,097 | B2 | 11/2021 | Said et al. |
| 11,195,857 | B2 | 12/2021 | Kai et al. |
| 11,201,107 | B2 | 12/2021 | Okina et al. |
| 11,322,466 | B2 | 5/2022 | Okina |
| 11,355,486 | B2 | 6/2022 | Mizutani et al. |
| 2007/0032059 | A1 | 2/2007 | Hedler et al. |
| 2011/0031633 | A1 | 2/2011 | Hsu et al. |
| 2011/0089572 | A1 | 4/2011 | Tezcan et al. |
| 2012/0132967 | A1 | 5/2012 | Andry et al. |
| 2015/0102497 | A1* | 4/2015 | Park .................... H01L 21/6835 257/774 |
| 2015/0380339 | A1 | 12/2015 | Zhao et al. |
| 2017/0179026 | A1 | 6/2017 | Toyama et al. |
| 2018/0145030 | A1 | 5/2018 | Beyne et al. |
| 2019/0051599 | A1 | 2/2019 | Zhang et al. |
| 2019/0296041 | A1 | 9/2019 | Yamasaka et al. |
| 2020/0020684 | A1 | 1/2020 | Chen et al. |
| 2020/0098776 | A1* | 3/2020 | Sugisaki ................ H10B 43/10 |
| 2020/0258816 | A1 | 8/2020 | Okina et al. |
| 2020/0258904 | A1 | 8/2020 | Kai et al. |
| 2020/0266146 | A1* | 8/2020 | Nishida ............... H01L 23/5383 |
| 2020/0295037 | A1 | 9/2020 | Iijima et al. |
| 2020/0381384 | A1 | 12/2020 | Huo et al. |
| 2021/0035965 | A1 | 2/2021 | Mizutani et al. |
| 2021/0327807 | A1 | 10/2021 | Chen et al. |

OTHER PUBLICATIONS

International Search Report and Written Opinion dated Feb. 22, 2022 for International Patent Application No. PCT/US2021/046455, 19 pages.

* cited by examiner

US 11,817,305 B2

FRONT END OF LINE INTERCONNECT STRUCTURES AND ASSOCIATED SYSTEMS AND METHODS

CROSS-REFERENCE TO RELATED APPLICATION

This application claims the benefit of U.S. Provisional Patent Application No. 63/175,443, filed on Apr. 15, 2021; U.S. Provisional Patent Application No. 63/071,969, filed on Aug. 28, 2020; and U.S. Provisional Patent Application No. 63/071,983, filed on Aug. 28, 2020, each of which are incorporated herein by reference in their entirety.

TECHNICAL FIELD

The present disclosure is generally directed to semiconductor devices, and in several embodiments, more particularly to systems and methods of forming pre-positioned front-end-of-line interconnect structures for backside electrical connections.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these and other demands, semiconductor die manufacturers often stack multiple semiconductor dies vertically on top of each other to increase the capacity or performance of a microelectronic device within the limited volume on the circuit board or other element to which the semiconductor dies are mounted. In vertical semiconductor die stack assemblies, through-silicon vias (TSV) are often used to make an electrical connection through a die.

In semiconductor device fabrication, front-end-of-line (FEOL) processing is used to form individual devices (transistors, capacitors, resistors, etc.) at the active side of the semiconductor substrate. In conventional semiconductor device assemblies, back-end-of-line (BEOL) processing of the substrate is used to form various interconnects for backside electrical connections, e.g., through silicon vias, metalization layers, bond pads, etc. Conventional BEOL processing methods for forming interconnects require extensive processing time and complex fabrication operations, and they also have limited design options for routing configurations. BEOL processing generally occurs immediately before a probe stage, where signals are physically acquired from the internal nodes of a semiconductor device for failure analysis and defect detection.

DETAILED DESCRIPTION

Figure 1A:
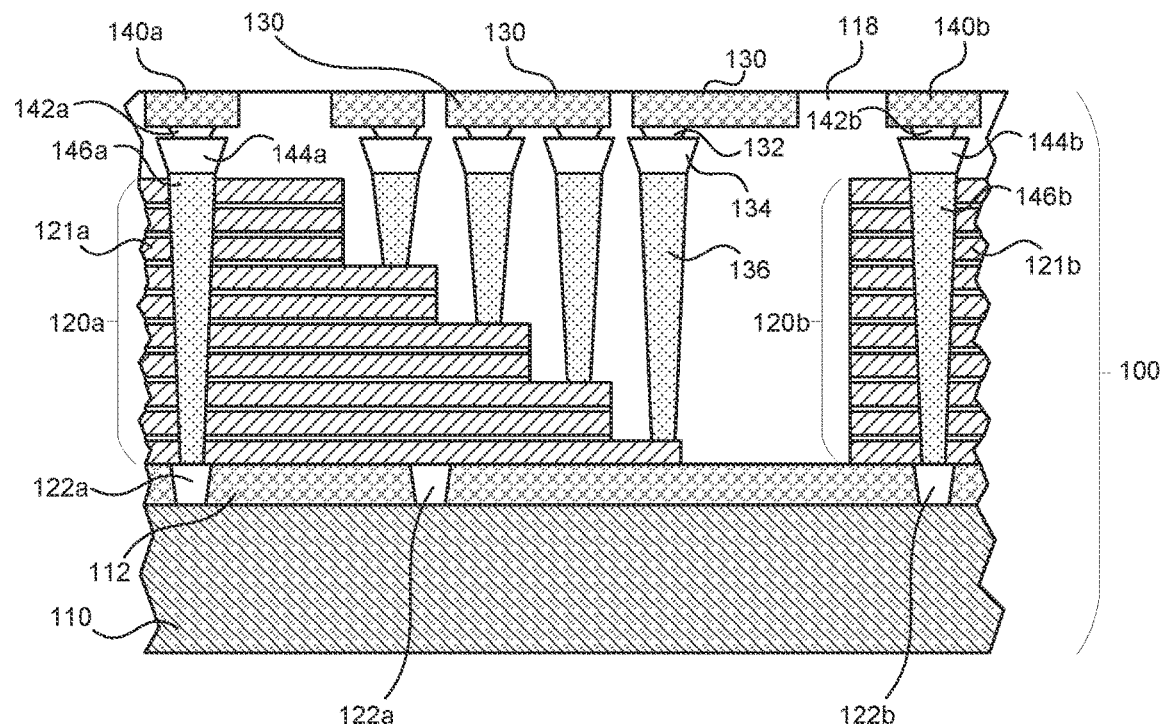
FIGS. 1A-1G are enlarged cross-sectional views showing various stages of fabricating a semiconductor device having a front-end-of-line interconnect structure in accordance with embodiments of the present technology.
Figure 1A:
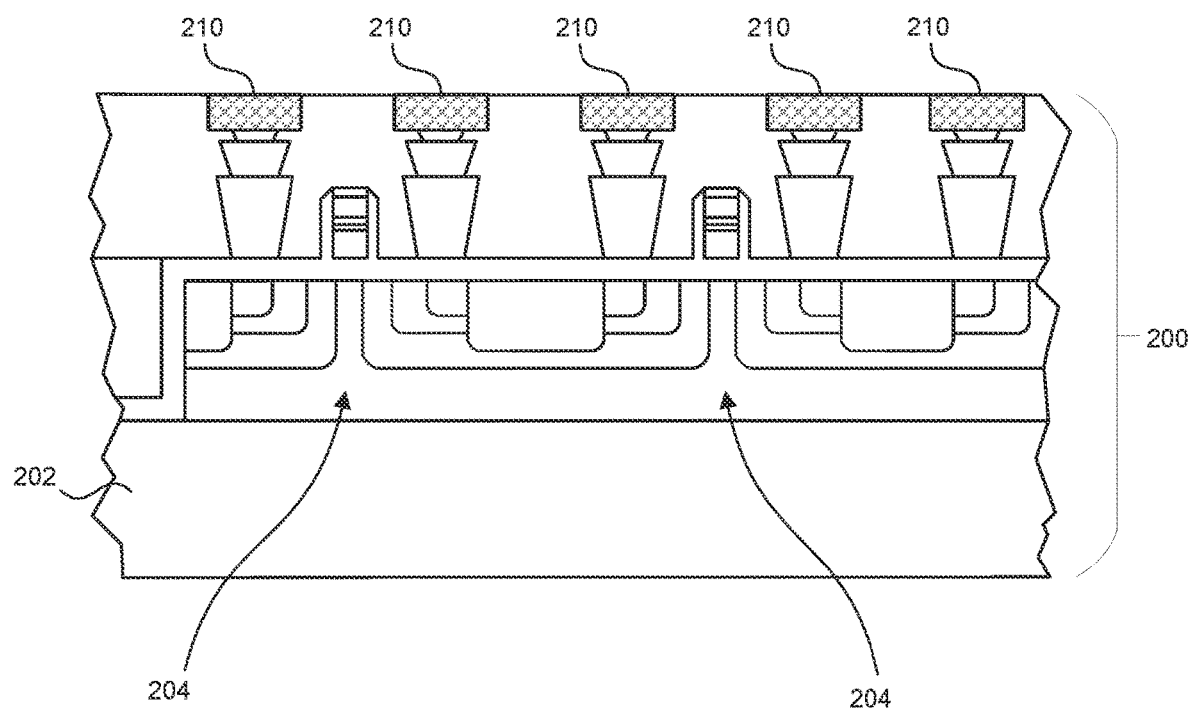
Figure 1B:
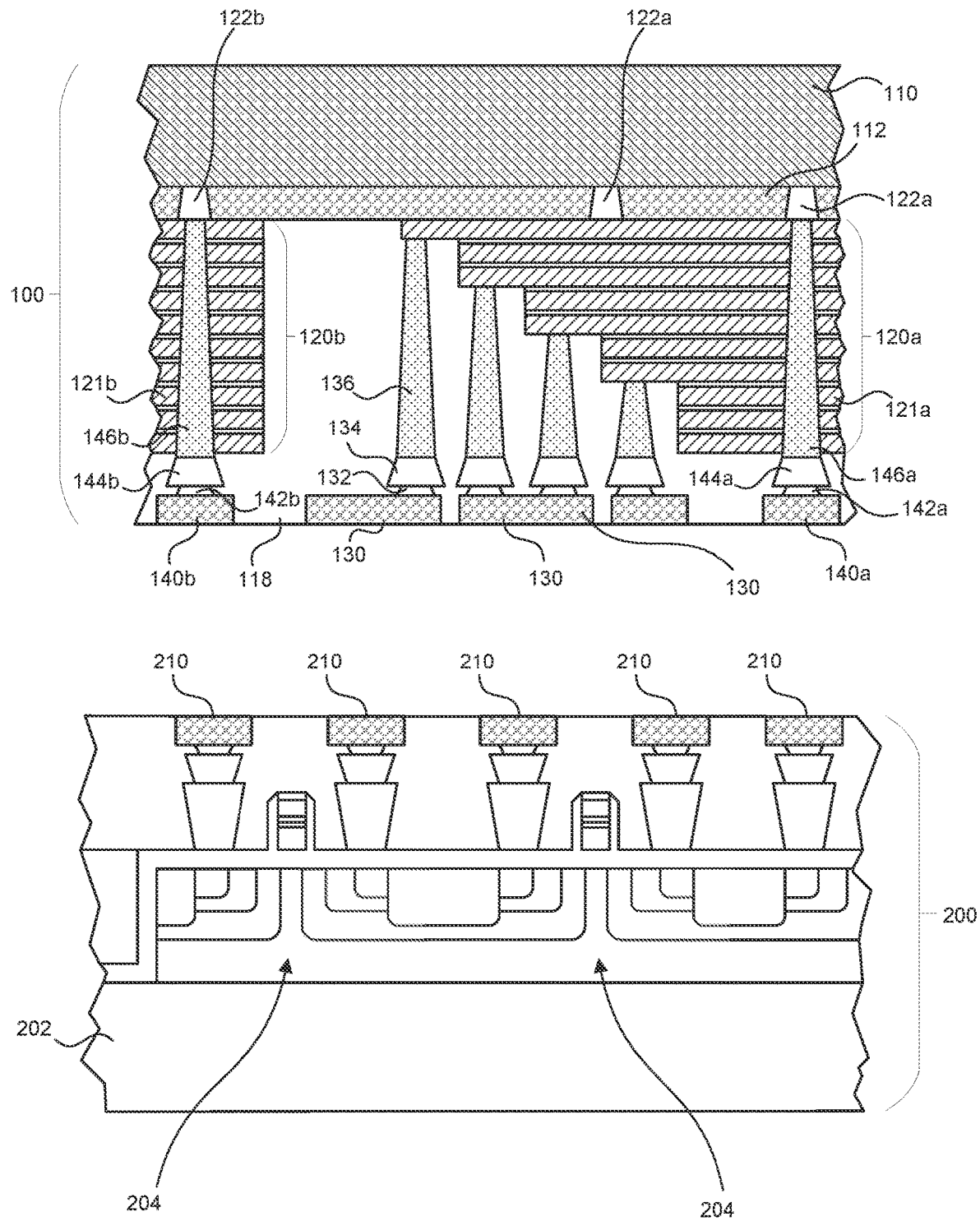

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device.

Depending upon the context in which it is used, the term "substrate" can refer to a structure that supports electronic components (e.g., a die), such as a wafer-level substrate, a singulated die-level substrate, or another die for die-stacking applications. Suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The present technology includes a semiconductor device having an interconnect structure for backside electrical connection formed (e.g., "pre-positioned") during front-end-of-line (FEOL) processing. FEOL is the stage of integrated circuit fabrication in which individual devices (transistors, capacitors, resistors, etc.) are formed at the active side of the semiconductor material. In contrast to the present technology, FEOL processes occur before fabricating metal interconnect structures at the backside. Conventional semiconductor device packages use back-end-of-line (BEOL) processing to form contact pads, through silicon vias, interconnect wires, and/or dielectric structures. During BEOL processing, metals and/or dielectric materials are deposited on the wafer to create contacts, insulating materials, metal levels, and/or bonding sites for chip-to-chip and chip-to-package connections. After BEOL processing, a probe stage is performed to physically acquire signals from the internal nodes of a semiconductor device for failure analysis and defect detection. Following the probe stage, post-probe processing is performed, which includes processes on the front side and/or the backside, including, e.g., three-dimensional integration (3DI) processing among other processing.

The present technology is generally directed to forming an interconnect structure during FEOL processing (e.g., gate level processing) at or near the active side of the die and exposing or otherwise accessing the pre-positioned interconnect structure during BEOL or post-probe processing with ultra-thin silicon processing or total silicon removal. In some embodiments, the present technology eliminates the need for forming BEOL TSVs, allows direct-to-device routing, and enables ultra-thin die stacking among other advantages over conventional process. In some embodiments, an interconnect area is formed in or on the substrate during first level FEOL processing. The FEOL processed interconnect or interconnect area has an active contact surface that is at least partially buried within the substrate material and/or dielectric materials during at least a portion of the FEOL processing. The FEOL interconnect is then revealed for access from the backside during BEOL or post-probe processing.

Various FEOL interconnect configurations are within the scope of the present technology, such as array, sacrificial oxide, etc., or any combination thereof. Processing of three-dimensional integration (3DI) using the present technology is expected to reduce cost and provide a high degree of design flexibility for routing and other structures. For example, backside routing components can be formed during FEOL processing and accessed for electrical connection through the substrate during BEOL or post-probe processing, as will be described below. In contrast, conventional processing requires forming backside routing components by patterning, etching, and filling deep holes in the silicon material to create through silicon vias during BEOL processing, which poses various challenges, e.g., etching and filling relatively deep holes, processing without damaging thin layers, layout design limitations, etc. In these regards, interconnects of the present technology are more directly integrated than conventional device connections. Some embodiments can be applied to bonded microelectronic devices, such as NAND circuits, among others. In these configurations, separate complementary metal-oxide-semiconductor (CMOS) and array chips are bonded together face-to-face. During FEOL processing, a FEOL interconnect is pre-positioned in the silicon material and/or the dielectric materials of the array chip assembly and accessed for electrical connection through the backside of the array chip assembly. In some embodiments, the CMOS assembly includes periphery circuit devices that support the array, but generally does not include memory cells and access devices; and the array assembly includes wordlines, bitlines, access devices, and memory cells, but generally does not include periphery circuit devices such as drivers, latches, controllers, regulators, etc.

FIGS. 1A-1F show enlarged cross-sectional views of various stages of fabricating a semiconductor device comprising an array chip assembly 100 ("array assembly 100") and a CMOS chip assembly 200 (CMOS 200) in accordance with embodiments of the present technology. The array assembly 100 includes a substrate 110, such as a silicon, silica, or silicate substrate, on which various materials and components may be formed. The array assembly 100 also includes a dielectric material 112 on the substrate 110. The dielectric material 112 can be silicon oxide or another non-conductive material grown or deposited on the substrate 110, or the dielectric material 112 can be a non-resin or other inorganic material capable of withstanding temperatures over 600° C. The dielectric material can have FEOL pre-positioned interconnects ("first FEOL interconnects 122a" and "second FEOL interconnects 122b"). The first and second FEOL interconnects 122a and 122b are at least partially embedded within the dielectric material 112 in this example. In other embodiments, the first and/or second FEOL interconnects 122a and 122b extend through the dielectric material 112 and are at least partially embedded within the substrate 110 such that the FEOL interconnects can be exposed from the backside without completely removing the substrate material.

The array assembly 100 may further include a first 3D memory array 120a proximate the dielectric material 112 and having a first plurality of stacked memory array layers 121a electrically connected to the first FEOL interconnects 122a, and a second 3D memory array 120b proximate the dielectric material 112 and having a second plurality of stacked memory array layers 121b electrically connected to the second FEOL interconnects 122b. The first and second 3D memory arrays 120a and 120b may be destined for separate memory devices after subsequent singulation and although each illustrated with ten array layers in a stacked configuration in the instant example, may have any number of array layers. The array assembly 100 may also have multi-height pillars 136 defining interconnects that electrically couple the first memory array layers 121a to one or more bond pads 130 through conductive traces/caps 132 and 134 (e.g., copper, solder, etc.). Although not shown, similar multi-height pillars, bond pads, traces, and caps may be associated with the second memory array layers 121b. In some embodiments, the array assembly 100 may also include one or more bond pads 140a electrically connected to the first FEOL interconnects 122a, for example using a TSV 146a connected to the bond pad 140a through conductive traces/caps 142a and 144a. Similarly, the array assembly 100 may also include one or more bond pads 140b electrically connected to the second FEOL interconnects 122b, for example using a TSV 146b connected to the bond pad 140b through conductive traces/caps 142b and 144b. A dielectric material 118 may encase components of the semiconductor device, e.g., the first and second 3D memory arrays 120a and 120b, the pillars 136, the bond pads 130, 140a, 140b, and 210, etc. Although one configuration of the array assembly 100 is depicted in the Figures, any suitable configuration of the array assembly 100 is also within the scope of the present technology.

Figure 1C:
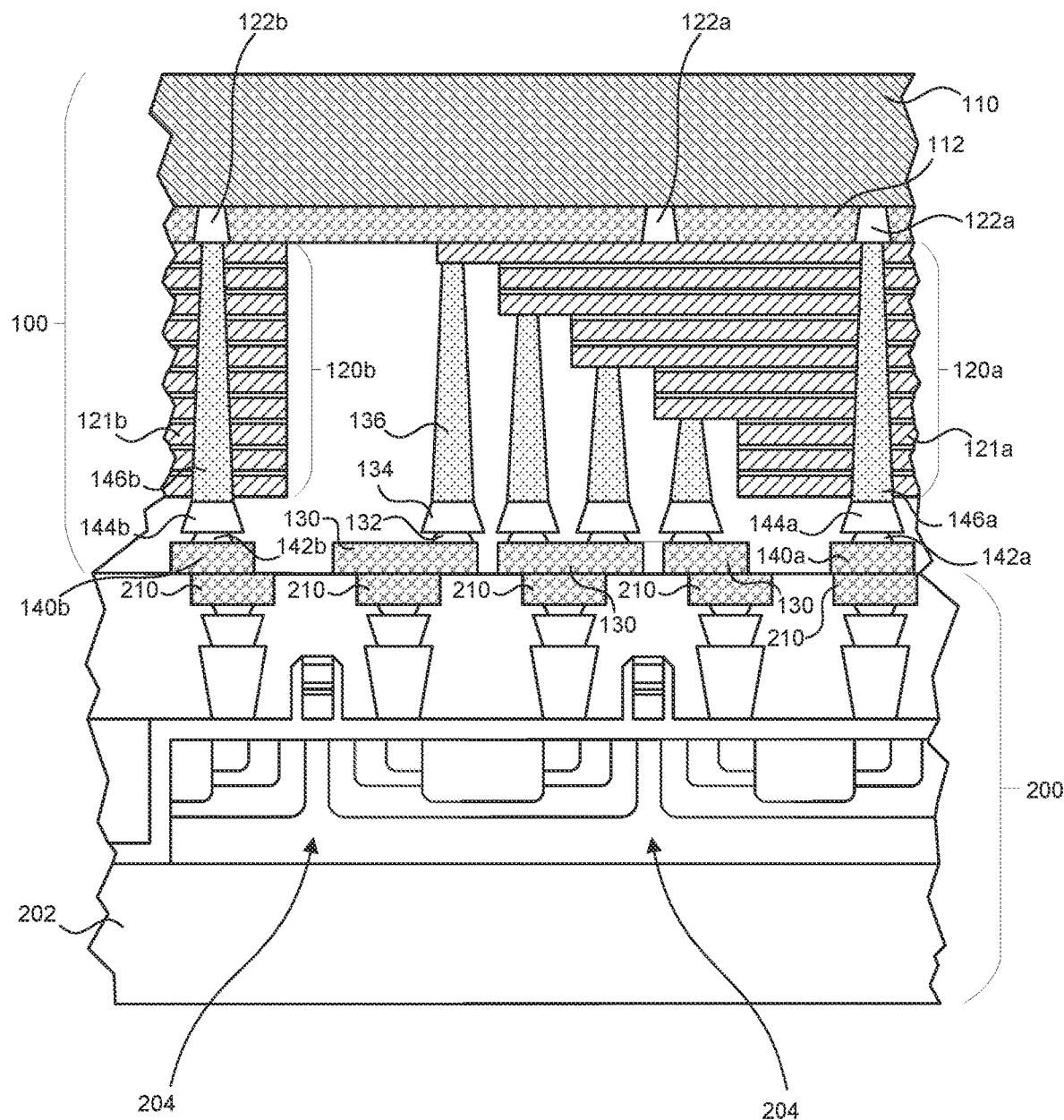

The CMOS 200 may be any suitable CMOS chip and includes a substrate 202, active electrical components 204 (e.g., transistor, etc.), and bond pads 210 configured to be electrically connected to the bond pads 130, 140a, and 140b of the array assembly 100. As shown in FIG. 1A, the array assembly 100 and the CMOS 200 are separately formed and prepared for bonding through the bond pads 130, 140a, and 140b of the array assembly 100, and bond pads 210 of the CMOS 200. Next, in FIG. 1B, the array assembly 100 is flipped such that the array assembly 100 and the CMOS 200 are face-to-face to position the bond pads 130, 140a, and 140b facing toward the bond pads 210. As shown, each bond pad of the array assembly 100 corresponds to a separate bond pad 210 of the CMOS 200; however, in other embodiments, any of the bond pads may be configured to bond to multiple other of the bond pads in a bridging configuration. In FIG. 1C, the bond pads 130, 140a, and 140b of the array assembly 100 are mated and bonded to the bond pads 210 of the CMOS 200 to form electrical connections between the array assembly 100 and the CMOS 200.

Figure 1D:
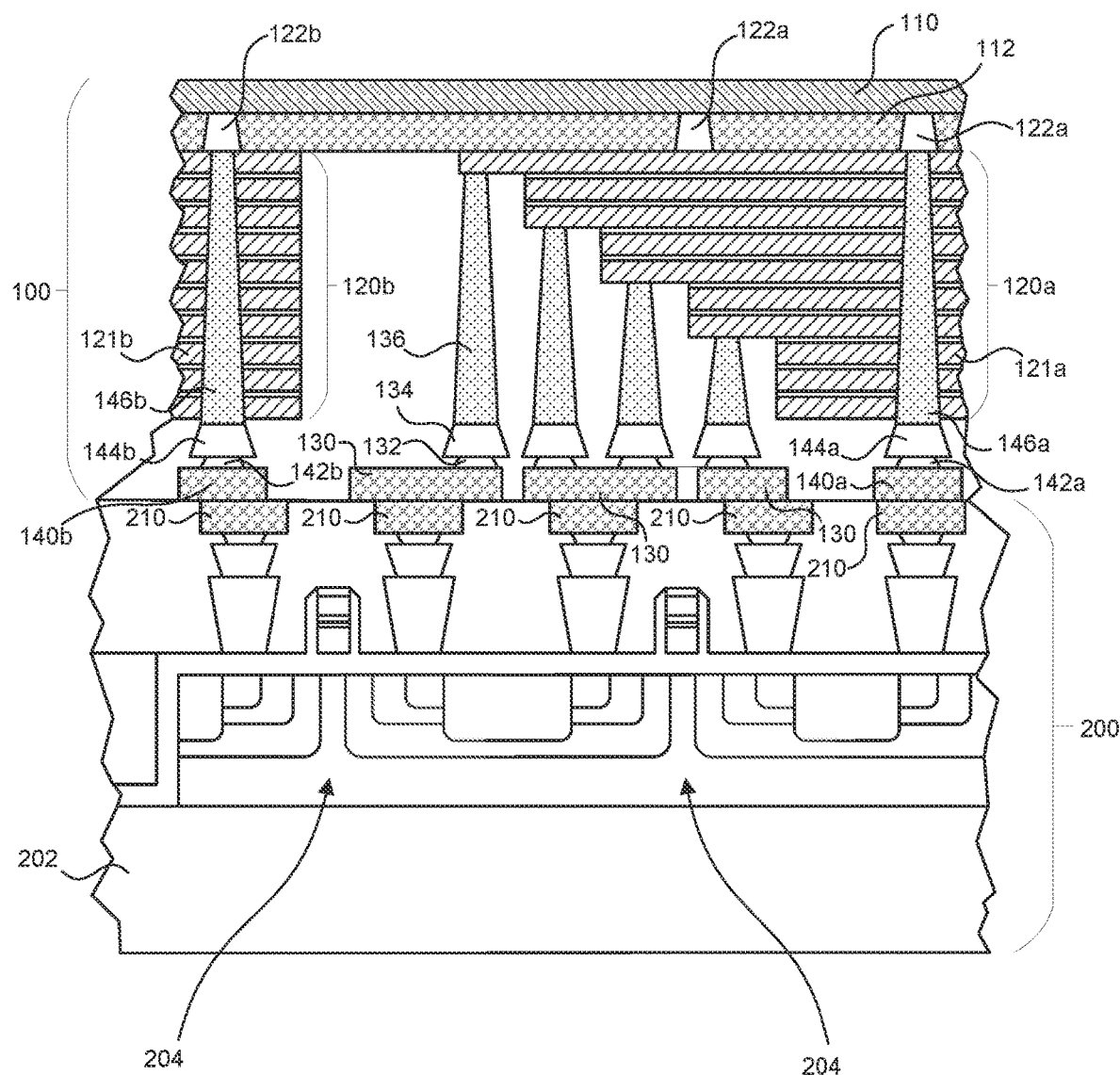
Figure 1E:
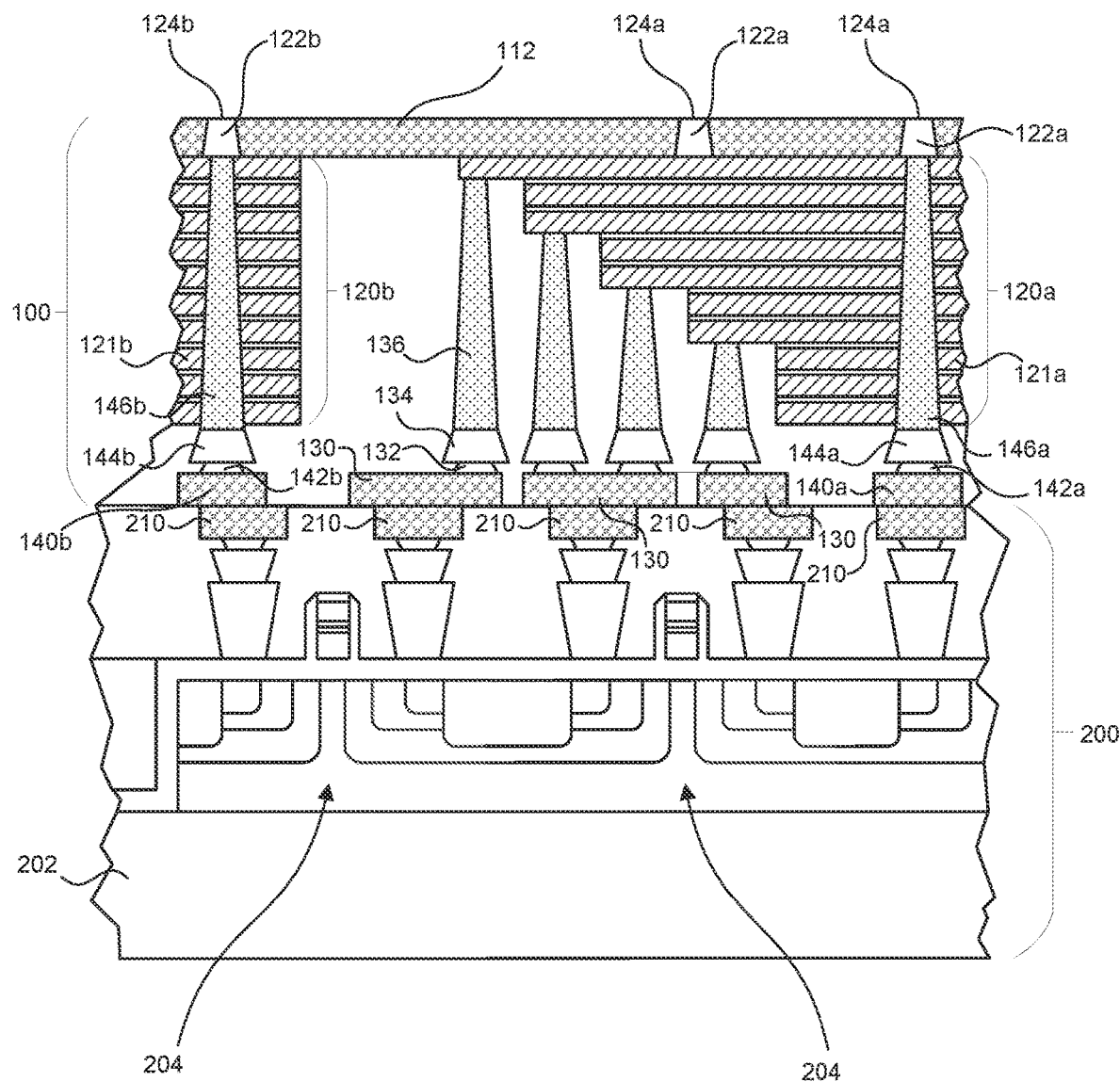
Figure 1F:
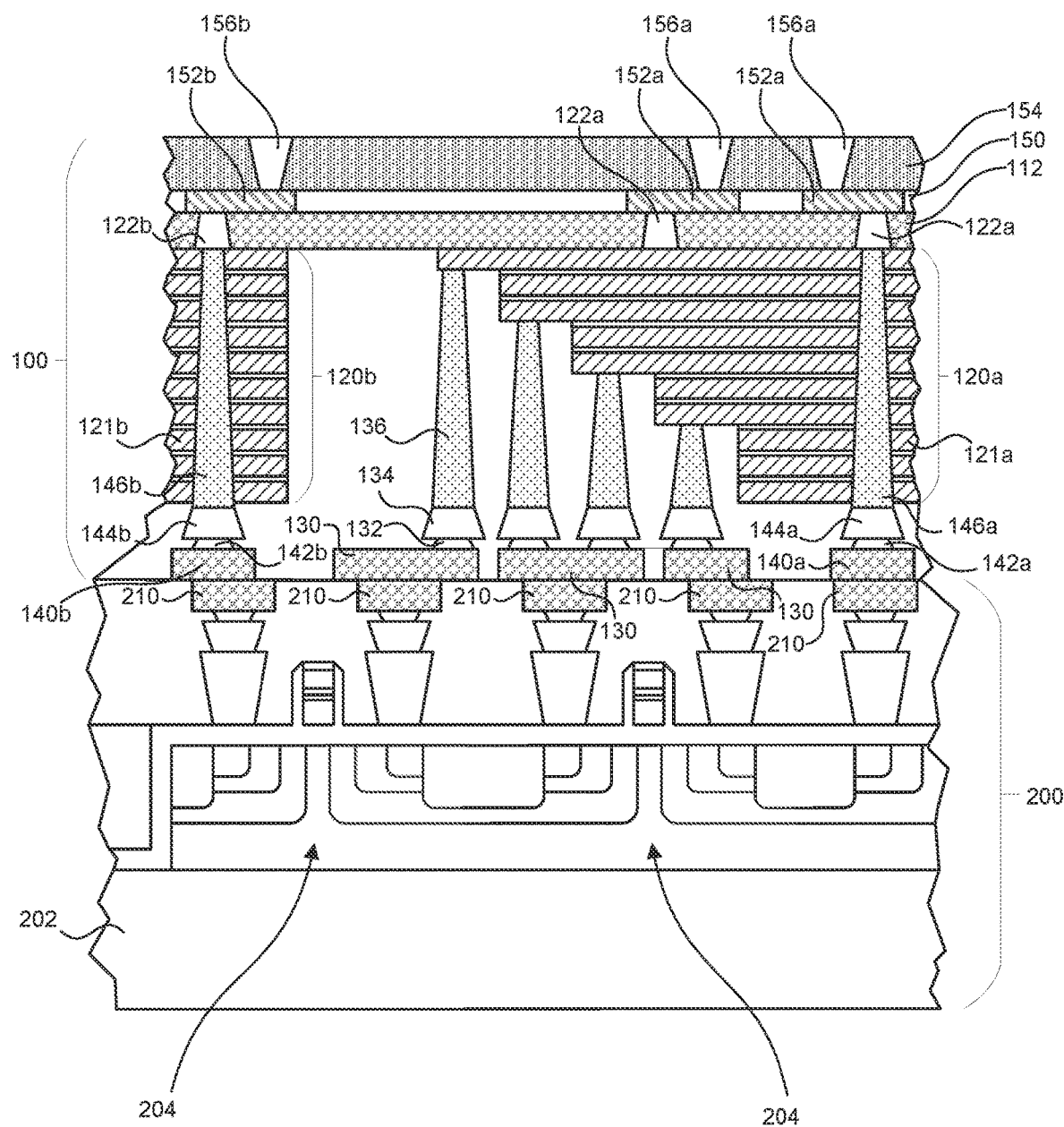
Figure 1G:
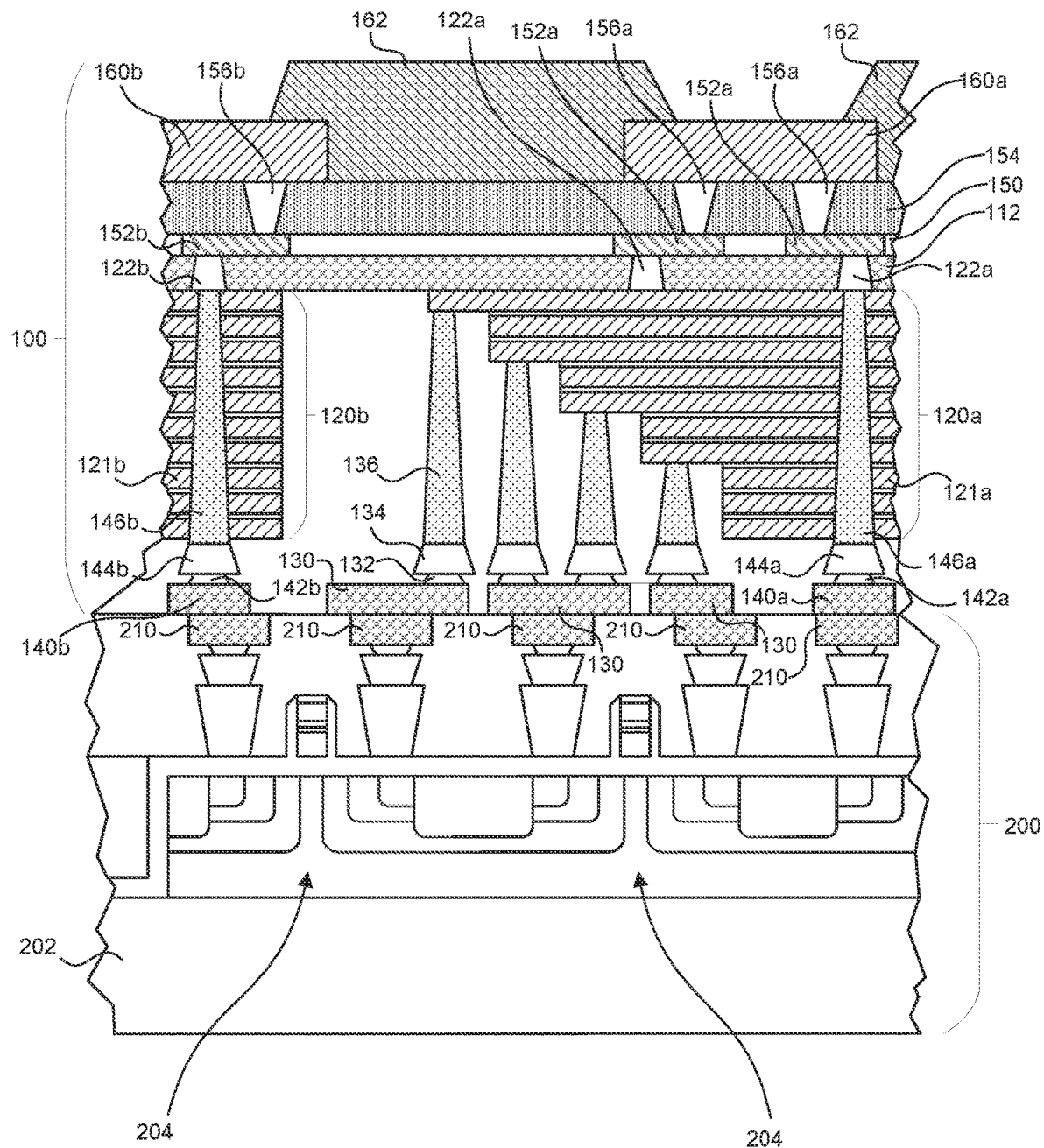

FIG. 1D shows a BEOL grinding process configured to remove material and thin the substrate 110; however, grinding is stopped prior to reaching the depth of the first and second FEOL interconnects 122a and 122b such that the devices and structure remains intact. As shown next in FIG. 1E, the silicon substrate 110 is removed by bulk silicon blanket etching, e.g., a wet etch, a dry etch, etc., to expose a backside 124a of the first FEOL interconnects 122a and a backside 124b of the second FEOL interconnects 122b accessible from the backside of the array assembly 100. During the removal of the silicon substrate 110, the dielectric material 112 may be exposed on the backside of the array assembly 100. FIG. 1F shows various backside routing features (formed during BEOL) for forming electrical connections through the FEOL interconnects 122a and 122b to components of the array assembly 100 (e.g., the first and second 3D memory arrays 120a and 120b). The routing features may be formed on the backside of the array assembly 100 with a first patterning process to create first and second conductive traces 152a and 152b in a second dielectric passive insulating material 150, and a second patterning process to create first and second routing interconnect vias 156a and 156b in a third dielectric material 154. In FIG. 1G, the first and second conductive routing interconnects 156a and 156b can be further patterned to create first and second bond pads 160a and 160b to receive assembly interconnects, solder balls, pillars, 3DI interconnects, etc. A dielectric passivation layer 162, e.g., a nitride or polyamide material, can be added to form the final pattern and protects the surface of the third dielectric material 154 from impingement during bonding. Although one configuration of an FEOL interconnect is shown in FIGS. 1A-1G, other configurations are within the scope of the present technology.

Figure 2A:
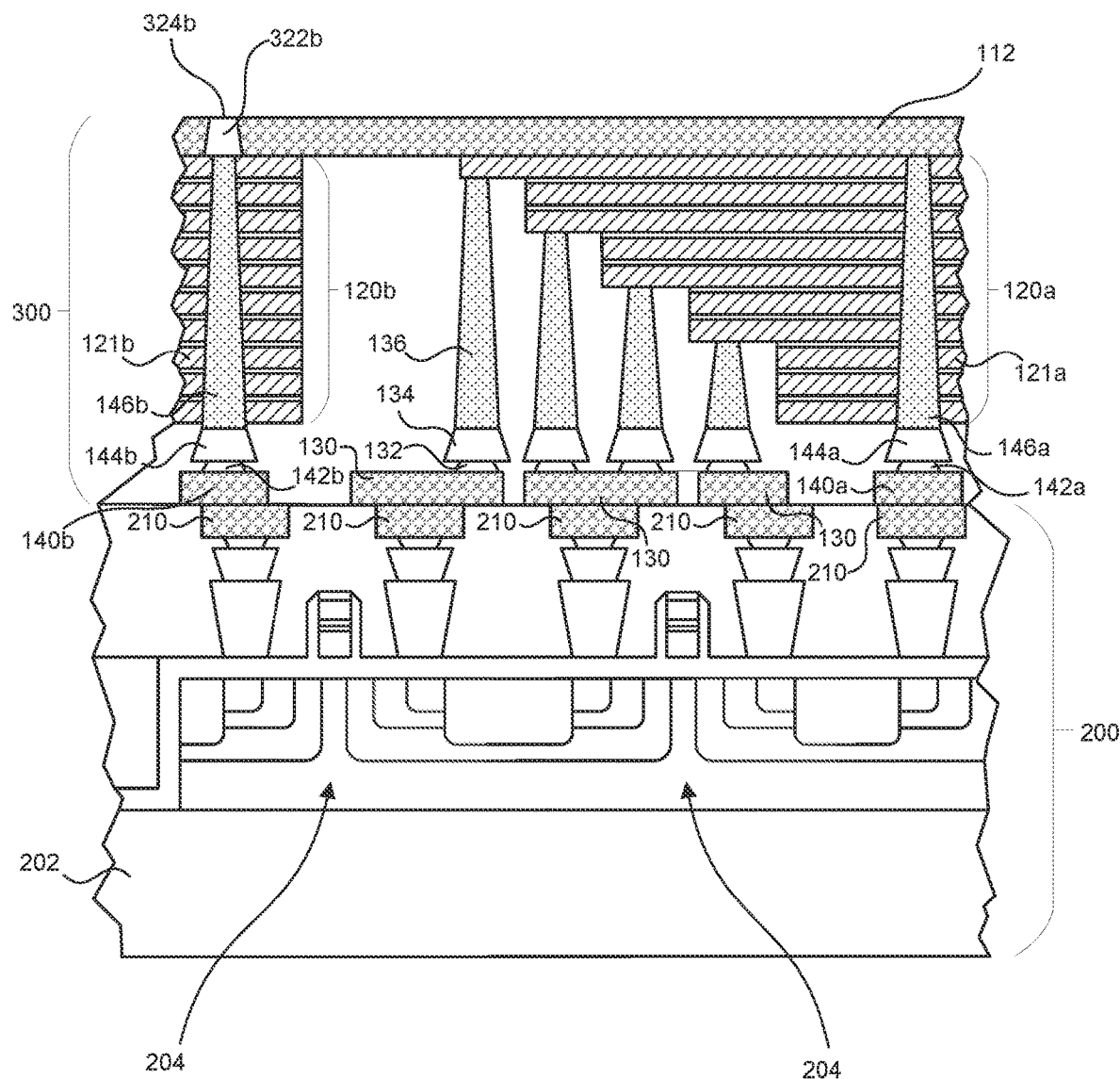
FIGS. 2A and 2B are enlarged cross-sectional views showing semiconductor devices having a front-end-of-line interconnect structure in accordance with embodiments of the present technology.
Figure 2B:
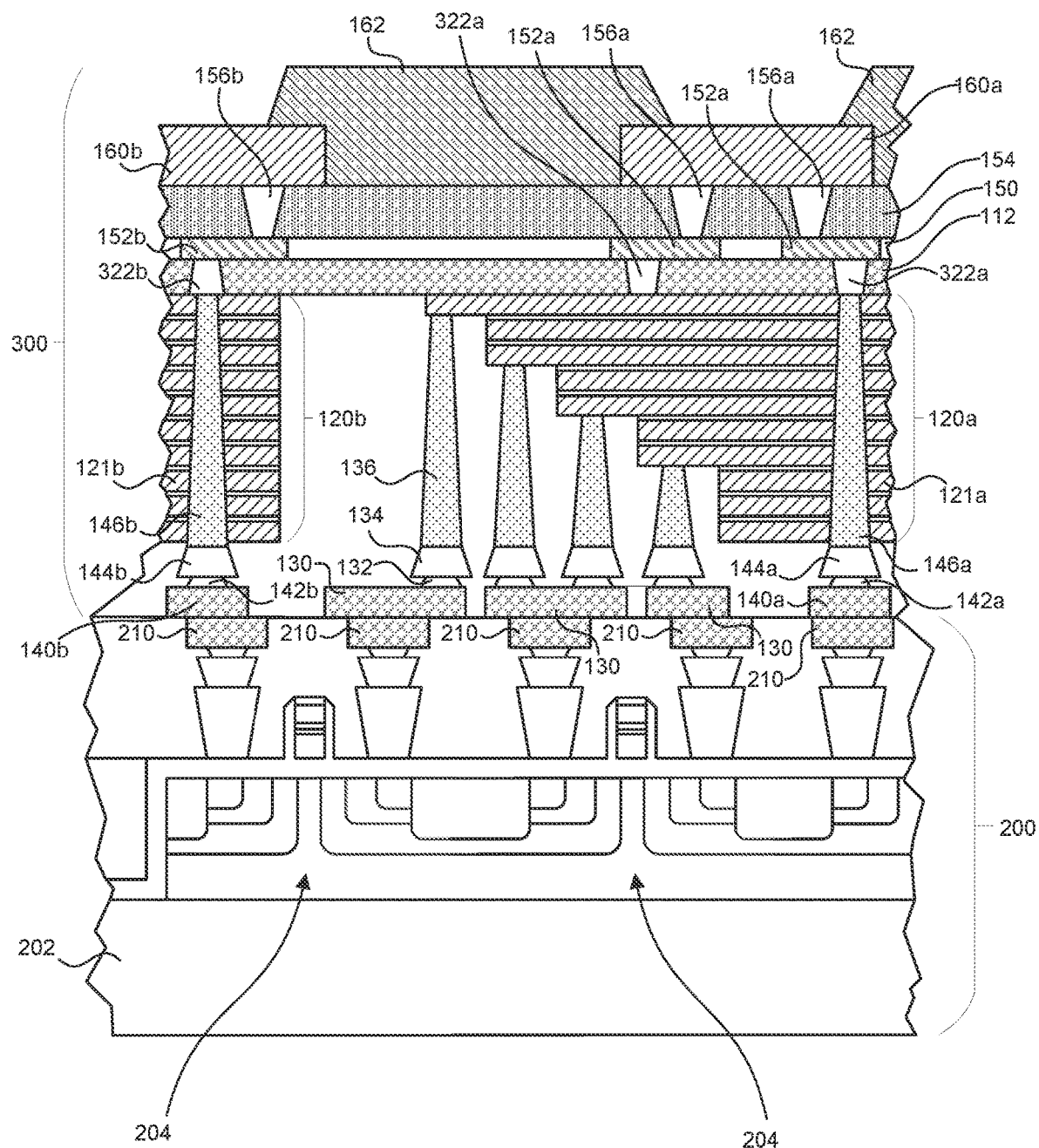

FIGS. 2A and 2B show enlarged cross-sectional views of semiconductor devices having an FEOL interconnect structure configured in accordance with additional embodiments of the present technology. FIGS. 2A and 2B show an array chip assembly 300 ("array assembly 300") which is similar in overall structure and configuration to the array assembly 100 of FIGS. 1A-1G, except that the array assembly 300 shows a variation of FEOL interconnects. The configurations of the FEOL interconnects in FIGS. 2A and 2B are intended to illustrate one variation of the FEOL interconnects; however, further suitable variations are within the scope of the present technology. In FIG. 2A, similar steps to those in FIGS. 1A-1E have already been performed to the semiconductor device having the array assembly 300 (e.g., bond pad connections, grinding, etching, and removal of the substrate, etc.), such that the exposed FEOL interconnect is shown (e.g., similar to the state of the semiconductor device in FIG. 1E). The CMOS 200 is shown with the same general configuration as in FIGS. 1A-1G. Like reference numbers to the embodiments of FIGS. 1A-1G refer to similar features in FIGS. 2A and 2B, but may have variations and/or have different shapes and sizes, while features in the 300-series in FIGS. 2A and 2B correspond to features of the array assembly 300 differing from the array assembly 100.

FIG. 2A shows an embodiment of the array chip assembly 300 bonded to the CMOS 200. The array assembly 300 includes FEOL interconnects 322b having a backside 324b, generally similar to the FEOL interconnects 122b of the array assembly 100 in that the FEOL interconnects 322b are formed in the dielectric material 112 during FEOL processing. The array assembly 300 omits FEOL interconnects corresponding to the FEOL interconnects 122a of the array assembly 100. Instead, as shown in FIG. 2B, BEOL interconnects 322a are formed during BEOL processing to form electrical connections with the first 3D memory array 120a. After the BEOL interconnects 322a are formed, the remaining operations for forming electrical connections with the FEOL interconnects 322b and the BEOL interconnects 322a, including the backside routing, final pad patterning, and passivation, are similar to those of FIGS. 1F and 1G, described above.

Figure 3A:
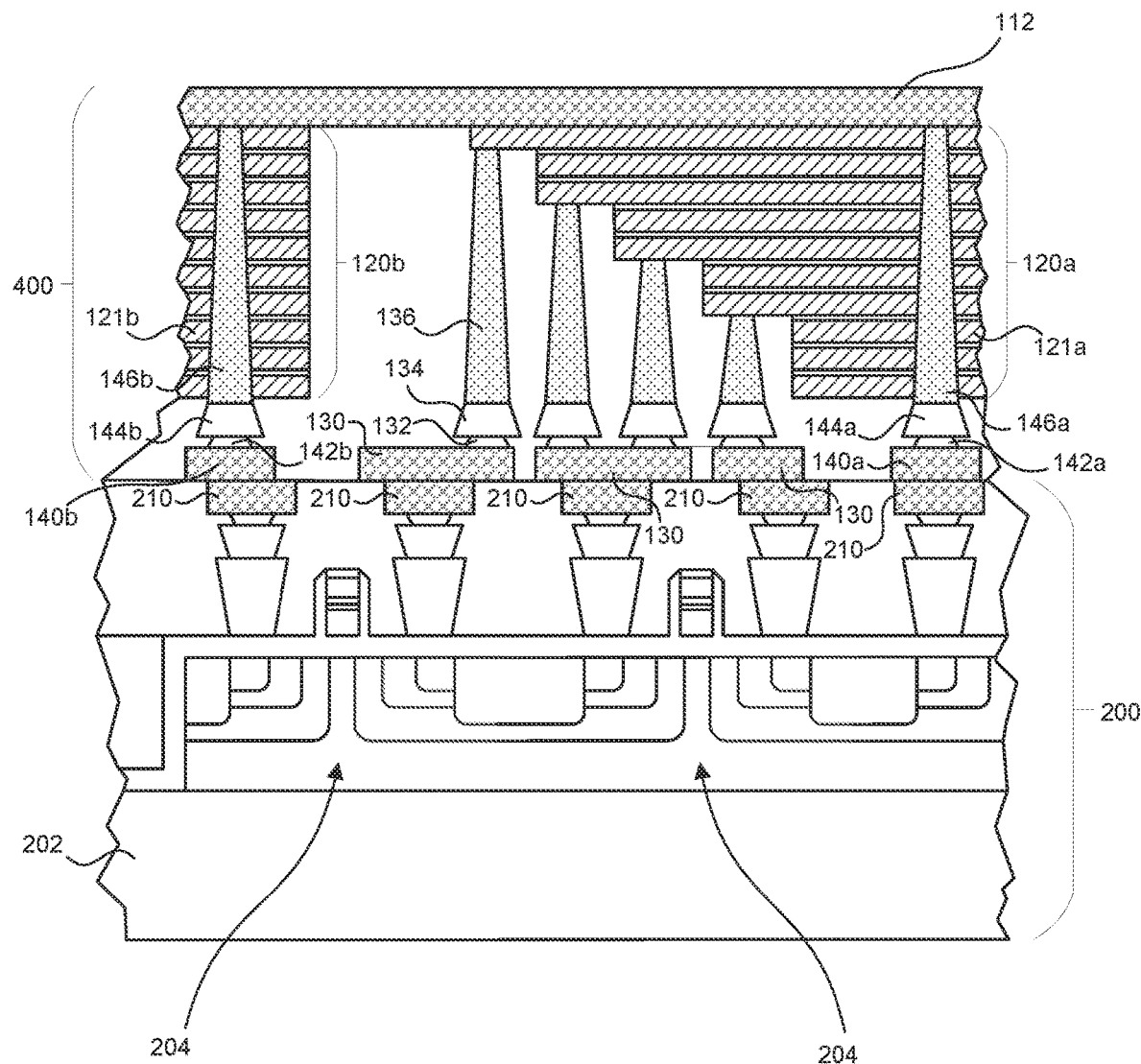
FIGS. 3A and 3B are enlarged cross-sectional views showing semiconductor devices having a front-end-of-line interconnect structure in accordance with embodiments of the present technology.
Figure 3B:
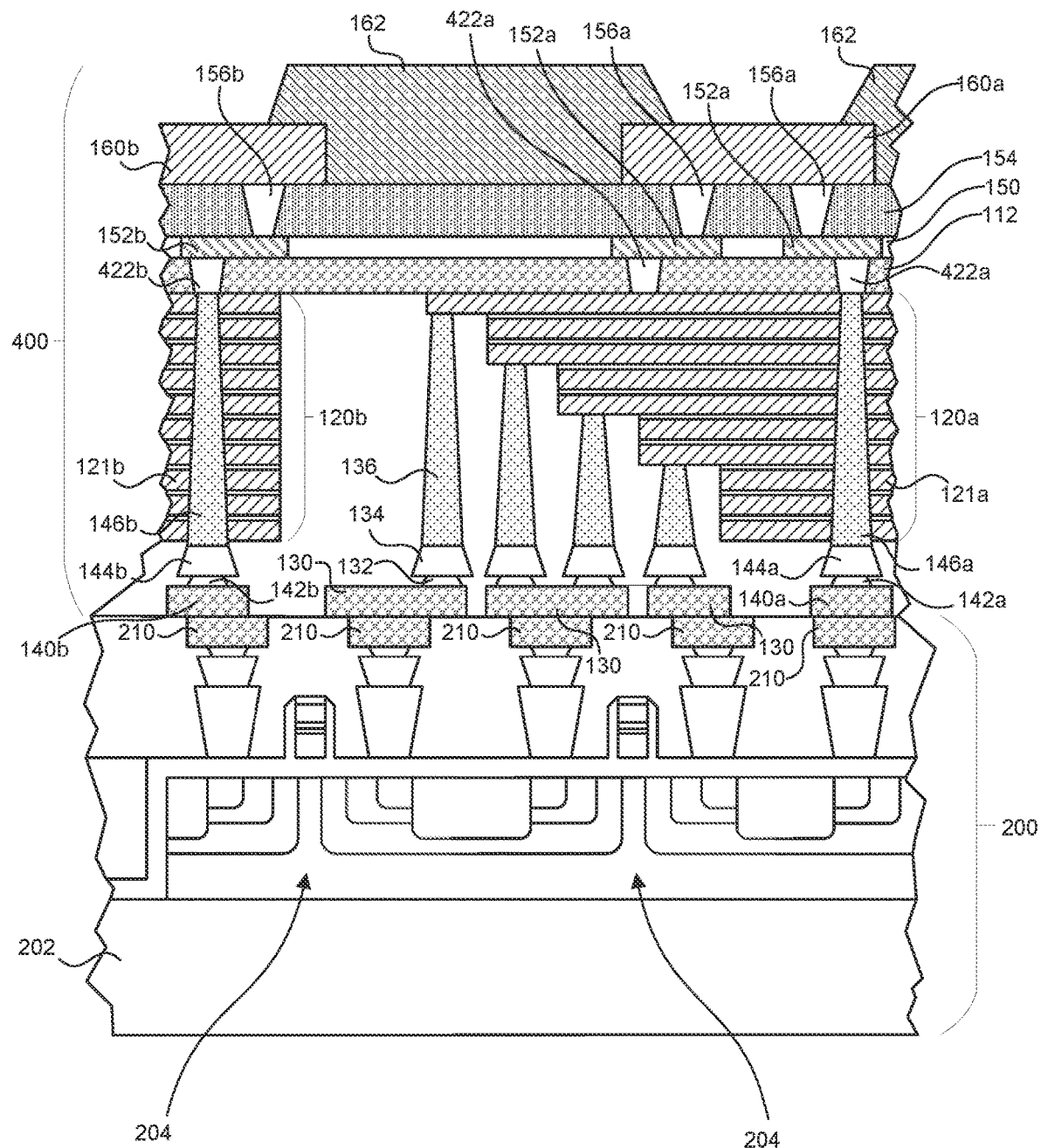

FIGS. 3A and 3B show enlarged cross-sectional views of semiconductor devices having been configured in accordance with additional embodiments of the present technology. FIGS. 3A and 3B show an array chip assembly 400 ("array assembly 400") which is similar in overall structure and configuration to the array assembly 100 of FIGS. 1A-1G, except that the array assembly 400 shows a variation of FEOL and BEOL processing. The configurations of the FEOL structure in FIGS. 3A and 3B are intended to illustrate one variation of the FEOL processing; however, further suitable variations are within the scope of the present technology. In FIG. 3A, similar steps to those in FIGS. 1A-1E have already been performed to the semiconductor device having the array assembly 400 (e.g., bond pad connections, grinding, etching, and removal of the substrate, etc.), such that the substrate is removed to expose the dielectric material (e.g., similar to the state of the semiconductor device in FIG. 1E, with a different FEOL structure). The CMOS 200 is shown with the same general configuration as in FIGS. 1A-1G. Like reference numbers to the embodiments of FIGS. 1A-1G refer to similar features in FIGS. 3A and 3B, but may have variations and/or have different shapes and sizes, while features in the 400-series in FIGS. 3A and 3B correspond to features of the array assembly 400 differing from the array assembly 100.

FIG. 3A shows an embodiment of the array chip assembly 400 bonded to the CMOS 200. The array assembly 400 does not have interconnect vias formed during FEOL processing (e.g., the interconnect vias 122a and 122b of the array assembly 100). The omission of such interconnect vias can prevent complications during BEOL processing, such as arcing during the etching process, and allows selective forming of interconnect vias in a desired layout pattern. In this regard, the first and second conductive traces 152a and 152b and the third dielectric material 154 can be omitted in some embodiments of the array assembly 400. As shown in FIG. 3B, first and second BEOL interconnect vias 422a and 422b are formed during BEOL processing for electrical connection to the first and second 3D memory arrays 120a and 120b on the backside of the array assembly 400. After the BEOL interconnects 422a and 422b are formed, the remaining operations for forming further electrical connections with the BEOL interconnects 422a and 422b, including the backside routing, final pad patterning, and passivation, are similar to those of FIGS. 1F and 1G, described above.

The interconnects described herein may be formed from suitable conductive materials, such as copper (Cu), and may have solder caps to form the electrical connections (e.g., tin-silver (SnAg) solder caps). During assembly, the solder cap can be reflowed using gang reflow, sonic reflow, or other techniques. The bond pads can be copper pads and may be bonded using copper-to-copper bonding or other suitable techniques.

Figure 4:
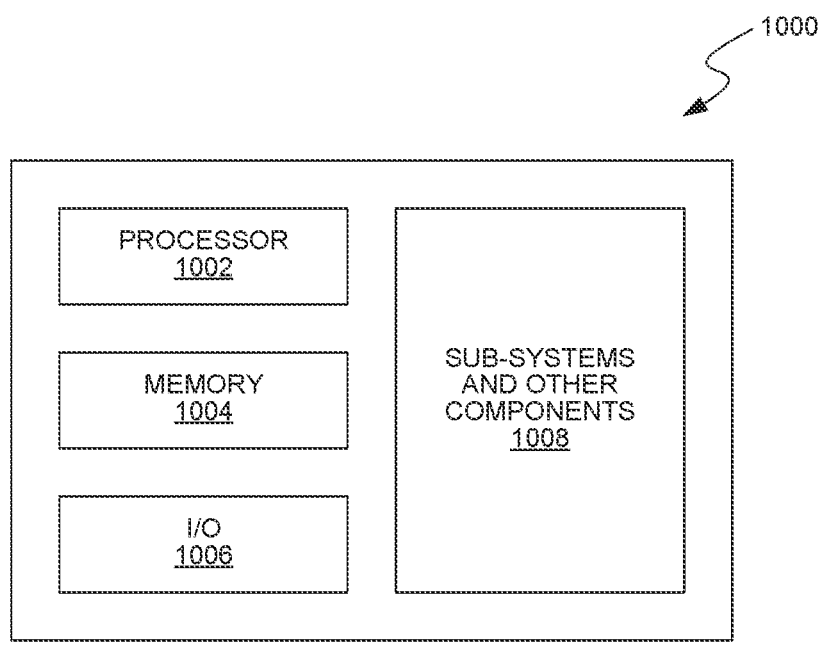
FIG. 4 is a schematic view of a system that includes a semiconductor device in accordance with embodiments of the present technology.

FIG. 4 is a block diagram illustrating a system that incorporates a semiconductor device in accordance with embodiments of the present technology. Any one of the semiconductor devices having the features described above with reference to FIGS. 1A-3B can be incorporated into any of a myriad of larger and/or more complex systems, a representative example of which is system 1000 shown schematically in FIG. 4. The system 1000 can include a processor 1002, a memory 1004 (e.g., SRAM, DRAM, flash, and/or other memory devices), input/output devices 1006, and/or other subsystems or components 1008. The semiconductor assemblies, devices, and device packages described above with reference to FIGS. 1A-3B can be included in any of the elements shown in FIG. 4. The resulting system 1000 can be configured to perform any of a wide variety of suitable computing, processing, storage, sensing, imaging, and/or other functions. Accordingly, representative examples of the system 1000 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1000 include lights, cameras, vehicles, etc. In these and other examples, the system 1000 can be housed in a single unit or distributed over multiple interconnected units, e.g., through a communication network. The components of the system 1000 can accordingly include local and/or remote memory storage devices and any of a wide variety of suitable computer-readable media.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

We claim:

1. A semiconductor device, comprising:
    a dielectric material having a backside formed on a front side of a semiconductor substrate material and a front side opposite the backside;
    an interconnect structure extending through at least a portion of the dielectric material, the interconnect structure having a backside defining an active contact surface and a front side opposite the backside;
    a semiconductor memory array proximate the front side of the dielectric material and electrically connected to the front side of the interconnect structure;
    an insulating material encasing at least a portion of the semiconductor memory array;
    an opening through which the active contact surface at the backside of the interconnect structure is exposed for electrical connection; and
    a conductive trace formed on the active contact surface and electrically connected to the semiconductor memory array through the interconnect structure.

2. The semiconductor device of claim 1, wherein the dielectric material comprises silicon dioxide.

3. The semiconductor device of claim 1, further comprising an interconnect via formed on the conductive trace and electrically connected to the semiconductor memory array through the conductive trace and the interconnect structure.

4. The semiconductor device of claim 1, further comprising a passivation layer formed on the dielectric material.

5. The semiconductor device of claim 4, wherein the passivation layer comprises a nitride material or a polyamide material.

6. The semiconductor device of claim 1 wherein the dielectric material comprises a non-resin material.

7. The semiconductor device of claim 1, wherein:
    the semiconductor memory array comprises a base array layer and additional array layers stacked on the base array layer to define a stacked memory array, and the semiconductor device includes bond pads electrically connected to the stacked memory array; and
    a CMOS chip assembly electrically connected to the stacked memory array via the bond pads.

8. The semiconductor device of claim 7, wherein, when the stacked memory array and the CMOS chip assembly are bonded, the active contact surface of the interconnect structure is electrically connected to a component of the CMOS chip assembly.

9. A semiconductor device, comprising:
    a dielectric material having a backside formed on a front side of a semiconductor substrate material and a front side opposite the backside;
    a semiconductor memory array proximate the front side of the dielectric material;
    an insulating material encasing at least a portion of the semiconductor memory array;
    an opening through the dielectric material to the semiconductor memory array;
    an interconnect structure extending through the opening of the dielectric material, the interconnect structure having a backside defining an active contact surface and a front side opposite the backside electrically connected to the semiconductor memory array, wherein the active contact surface at the backside of the interconnect structure is exposed for electrical connection; and
    a conductive trace formed on the active contact surface and electrically connected to the semiconductor memory array through the interconnect structure.

10. The semiconductor device of claim 9, further comprising an interconnect via formed on the interconnect structure and electrically connected to the semiconductor memory array.

11. The semiconductor device of claim 9, further comprising a passivation layer formed on the dielectric material.

12. The semiconductor device of claim 11, wherein the passivation layer comprises a nitride material or a polyamide material.

13. The semiconductor device of claim 9, wherein:
the semiconductor memory array comprises a base array layer and additional array layers stacked on the base array layer to define a stacked memory array, and the semiconductor device includes bond pads electrically connected to the stacked memory array; and
a CMOS chip assembly electrically connected to the stacked memory array via the bond pads.

14. The semiconductor device of claim 13, wherein, when the stacked memory array and the CMOS chip assembly are bonded, the active contact surface of the interconnect structure is electrically connected to a component of the CMOS chip assembly.

15. A method for forming an electrical connection on the backside of a semiconductor device, the method comprising:
forming, during front-end-of-line processing of the semiconductor device—
a dielectric material on a semiconductor substrate material, the dielectric material having a backside on a front side of the substrate material and a front side opposite the backside;
an interconnect structure through the dielectric material to the substrate material, the interconnect structure having a backside electrically connected to a semiconductor memory array proximate the front side of the dielectric material and having a front side opposite the backside; and
an active contact surface on the backside of the interconnect structure;
exposing the active contact surface for electrical connection access by removing the substrate material adjacent to the active contact surface; and
forming a conductive trace on the active contact surface to electrically connect the conductive trace to the semiconductor memory array through the interconnect structure.

16. The method of claim 15, wherein the interconnect structure comprises a first interconnect structure and the semiconductor memory array comprises a first semiconductor memory array, and wherein the method further comprises forming, during back-end-of-line processing of the semiconductor device, a second interconnect structure through the dielectric material, the second interconnect structure having a backside electrically connected to a second semiconductor memory array proximate the front side of the dielectric material.

17. The method of claim 15, further comprising forming a passive insulating material on the dielectric material after removing the substrate material.

18. The method of claim 15, wherein removing the substrate material comprises forming an opening through the substrate material to expose the active contact surface.

19. The method of claim 15, wherein:
the semiconductor device is an array chip assembly; and
the array chip assembly is bonded to a CMOS chip assembly prior to removing the substrate material adjacent to the active contact surface to expose the active contact surface.

* * * * *